United States Patent
Bothra et al.

(10) Patent No.: US 6,221,759 B1
(45) Date of Patent: *Apr. 24, 2001

(54) METHOD FOR FORMING ALIGNED VIAS UNDER TRENCHES IN A DUAL DAMASCENE PROCESS

(75) Inventors: Subhas Bothra, San Jose; Stephen L. Skala, Fremont, both of CA (US)

(73) Assignee: Philips Electronics North America Corp., New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/100,639

(22) Filed: Jun. 19, 1998

(51) Int. Cl.[7] ................................ H01L 21/4763
(52) U.S. Cl. ..................... 438/627; 438/629; 438/633; 438/638
(58) Field of Search .................... 438/668, 637, 438/638, 618, 627, 629, 633

(56) References Cited

U.S. PATENT DOCUMENTS

| | | | |
|---|---|---|---|
| 4,832,789 | * 5/1989 | Cochran et al. | 156/644 |
| 5,759,914 | * 6/1998 | Park | 438/624 |
| 5,795,684 | * 8/1998 | Troccolo | 430/5 |
| 5,891,799 | * 4/1999 | Tsui | 438/624 |
| 5,960,317 | * 9/1999 | Jeong | 438/633 |

\* cited by examiner

Primary Examiner—Olik Chaudhuri
Assistant Examiner—Kurt Eaton
(74) Attorney, Agent, or Firm—Martine Penilla & Kim, LLP

(57) ABSTRACT

Disclosed is a method for forming an aligned via under a trench to prevent voiding in a dual damascene process. The trench is formed in an oxide layer that is formed over a first metal layer and the first metal layer is formed over a semiconductor substrate. The method includes forming an etch stop layer over the oxide layer and forming a set of adjacent trenches in the oxide layer through a portion of the etch stop layer. The method also includes forming a resist layer at least partially over the etch stop layer. The resist layer is formed in a via pattern to expose the set of adjacent trenches through the via pattern. The method further includes etching the oxide layer under the set of adjacent trenches until the oxide layer is etched through to expose at least a portion of the first metal layer so as to form a via under each of the adjacent trenches. In this process, the etch stop layer inhibits the oxide layer underneath from being etched substantially such that each of the vias formed under the each of the adjacent trenches is substantially of a same width as and in alignment with the associated trench above.

46 Claims, 10 Drawing Sheets

METHOD FOR FORMING ALIGNED VIAS UNDER TRENCHES IN A DUAL DAMASCENE PROCESS

BACKGROUND OF THE INVENTION

1. Field of the Invention

This invention relates generally to the manufacture of semiconductor devices, and more particularly to a method for encapsulating a metal via in a damascene process.

2. Description of the Related Art

Since the introduction of semiconductor devices, the size of semiconductor devices have been continuously shrinking, resulting in smaller semiconductor chip size and increased device density on the chip. One of the limiting factors in the continuing evolution toward the smaller device size and higher density has been the interconnect area needed to route interconnect lines between devices. As a way to overcome such a limitation, multilevel interconnection systems have been implemented using shared interconnect lines between two or more levels.

Originally, conventional process techniques implemented multilevel interconnection systems by depositing a metal layer, photomasking the deposited metal layer, and then etching the metal layer to form a desired interconnection. However, since metals are typically more difficult to pattern and etch than other semiconductor layers such as dielectric or oxide layers, dual damascene process has been implemented to form metal vias and interconnects by dispensing entirely with the metal etching process. Dual damascene process is a well known semiconductor fabrication method for forming metal vias and interconnect lines.

In conventional dual damascene processes, a via and a trench are etched in an oxide layer such as an intermetal dielectric layer. The dielectric layer is typically formed over a metal layer. The via and the trench are then filled with a metal (e.g., Al, Cu) in the vias and trenches to form the metallization vias and interconnect lines, respectively. The excess metal above the trench level is then removed by well known chemical-mechanical polishing (CMP) process.

Dual damascene process is gaining wider application in semiconductor process because it offers significant advantages over conventional process of etching metals. For example, it does not require etching of metals, such as copper and to a lesser degree, aluminum, which are more difficult to pattern and etch than dielectric materials. Additionally, the dual damascene process involves less process steps than conventional techniques that form vias as a separate step.

In general, however, a via or a trench becomes progressively more difficult to fill completely when the depth of the via or trench increases with respect to the width. In this context, the ratio of the depth to the width of a via or trench is referred to as "aspect ratio." The higher aspect ratio of the via and trench, the more difficult it becomes to fill them completely. Since a via is typically formed directly beneath a trench in a conventional dual damascene process, the height (i.e., depth) of the via and trench combination is generally is greater than either a via or a trench alone. The greater depth of the via and trench combination thus leads to voiding problem when metal is filled in the via and trench during the dual damascene process.

The voiding problem is particularly problematic for the via because the via is generally smaller in width (e.g., diameter) than the trench but has a greater depth from the opening of the trench to the bottom of the via. Furthermore, during the dual damascene process, the via is often formed in a mis-aligned fashion with respect to the trench above. The improper alignment between the via and the trench may significantly increase the aspect ratio of the via. For example, when the trench is not formed directly above the via, the width or the opening of the via decreases, which typically leads to voiding in the via when filled with a metal. Additionally, when a mis-aligned via is formed at the end of a metal interconnect line, the aspect ratio further increases due to line shortening effects during lithography.

The problem of a mis-aligned via with high aspect ratio, which leads to a voiding effect is illustrated in Prior Art FIGS. 1A and 1B. Prior Art FIG. 1A shows a cross sectional view of a silicon wafer stack 100 formed by a conventional dual damascene process. The wafer stack 100 includes a semiconductor substrate 102, an oxide layer 104, a metal layer 106, a first intermetal oxide (IMO) layer 108, a second IMO layer 110, and a third IMO layer 112. The metal layer 106 is formed over the oxide layer 104, which is formed over the substrate 102.

The wafer stack 100 has a via 114, which is mis-aligned with respect to a trench 116 formed over the via 114. That is, the position of the via 114 is skewed to one side and is not disposed in the center of the metal layer 106 or the trench 116. The depth of the via 114 is significantly greater than the width or the opening of the via 114. Accordingly, the aspect ratio of the via is relatively high.

Prior Art FIG. 1B illustrates the wafer stack 100 after filling the via 114 and the trench 116 with a metal 122 and a barrier layer 118. Due to the high aspect ratio of the via 114, metal 122 does not fill the via 114 completely. That is, a void is formed within the via 114.

As illustrated in Prior Art FIG. 1B, a result of the mis-aligned via with a high aspect ratio is the formation of void within the via when the via is subsequently filled with a metal. The void often forms due to the high aspect ratio of the via. Subsequently, the void within the filled via may cause reliability problem in an integrated circuit and lead to failure of a semiconductor device. In addition, the mis-aligned via typically results in a smaller overlap area between the via and the trench. The smaller overlap area generally increases via resistivity during operation. The mis-aligned vias with consequent high aspect ratios result in reduced process margins, lower yield, and lower reliability of semiconductor devices.

In view of the foregoing, what is needed is a method for forming a properly aligned via with a trench in a dual damascene process. In addition, what is also needed is a method for preventing voids in a metal via to ensure fabrication of more reliable semiconductor devices.

SUMMARY OF THE INVENTION

Broadly speaking, the present invention fills these needs by providing a method for a method for forming aligned vias under trenches in a dual damascene process. It should be appreciated that the present invention can be implemented in numerous ways, including as a process, an apparatus, a system, a device, or a method. Several inventive embodiments of the present invention are described below.

In one embodiment, the present invention provides a method for forming an aligned via under a trench to prevent voiding in a dual damascene process. The trench is formed in an oxide layer that is formed over a first metal layer and the first metal layer is formed over a semiconductor substrate. The method includes forming an etch stop layer over the oxide layer and forming a set of adjacent trenches in the oxide layer through a portion of the etch stop layer. The method also includes forming a resist layer at least partially over the etch stop layer. The resist layer is formed in a via pattern to expose the set of adjacent trenches through the via pattern. The method further includes etching the oxide layer under the set of adjacent trenches until the oxide layer is etched through to expose at least a portion of the first metal layer so as to form a via under each of the adjacent trenches. In this process, the etch stop layer inhibits the oxide layer underneath from being etched substantially such that each of the vias formed under the each of the adjacent trenches is substantially of a same width as and in alignment with the associated trench above.

In another embodiment, the present invention provides a method for forming a via aligned with a trench to prevent voiding in a dual damascene process. The trench is formed in an intermetal oxide (IMO) layer that is formed over a first metal layer. A first metal layer formed over a semiconductor substrate. The method includes: (a) forming an IMO layer over the first metal layer; (b) forming an etch stop layer over the IMO layer; (c) forming a set of adjacent trenches in the IMO layer through a portion of the etch stop layer; (d) forming a resist layer at least partially over the etch stop layer, the resist layer being formed in a via pattern to expose the set of adjacent trenches through the via pattern; and (e) etching the IMO layer under the set of adjacent trenches until the IMO layer is etched through to expose at least a portion of the first metal layer so as to form a via under each of the adjacent trenches, the etch stop layer inhibiting the IMO layer underneath from being etched substantially, each of the vias formed under the each of the adjacent trenches being substantially of a same width as and in alignment with the associated trench above.

In yet another embodiment, the present invention provides a method for forming aligned vias under trenches to prevent voiding in a dual damascene process with one via under each trench. The trenches are formed in an oxide layer that is formed over a first metal layer. The first metal layer formed over a semiconductor substrate. The method includes forming an etch stop layer over the oxide layer such that the etch stop layer is not formed in the trenches and forming a resist layer at least partially over the etch stop layer. The resist layer is formed in a via pattern to expose a set of adjacent trenches through the via pattern. The method also includes forming a via under each of the adjacent trenches by etching the oxide layer under the set of adjacent trenches until the oxide layer is etched through to expose at least a portion of the first metal layer. In this process, the etch stop layer inhibits the oxide layer underneath from being etched substantially so that each of the vias formed under the each of the adjacent trenches is substantially of a same width as and in alignment with the associated trench above.

Advantageously, the present invention forms a resist layer arranged in a via pattern that is of sufficient size to expose a set of adjacent trenches together to etch a via in an oxide layer under each of the trenches. In addition, by providing an etch stop layer over an oxide layer, the present invention protects the oxide layer from being etched. The etching of the oxide layer using the combination of the resist layer and the etch stop layer ensures the formation of a via that is of same width as and in alignment with the trench above it. As a result, the vias will have significantly lower aspect ratio than vias formed through a conventional dual damascene process. Accordingly, the vias will be less prone to voiding problems when filled with a metal. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

Prior Art

DETAILED DESCRIPTION OF THE PREFERRED EMBODIMENTS

An invention is described for a method for forming aligned vias under trenches in a dual damascene process. It will be obvious, however, to one skilled in the art, that the present invention may be practiced without some or all of these specific details. In other instances, well known process operations have not been described in detail in order not to unnecessarily obscure the present invention.

To form aligned vias under trenches in a dual damascene process, the present invention forms a resist layer arranged in a via pattern. The via pattern is of sufficient size to expose a set of adjacent trenches together to etch a via in an oxide layer under each of the trenches. In addition, the present invention provides an etch stop layer over an oxide layer to protect the oxide layer from being etched while the vias are being etched. The etching of the oxide layer using the combination of the resist layer and the etch stop layer ensures the formation of a via that is of same width as and in alignment with the trench above.

Figure 1A:
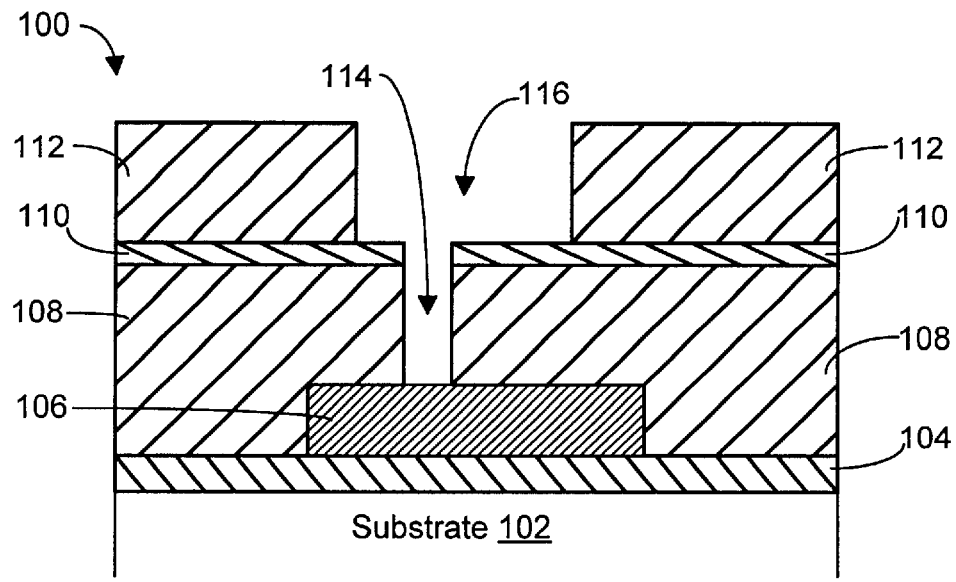
FIG. 1A shows a cross sectional view of a silicon wafer stack formed by a conventional dual damascene process.
Figure 1B:
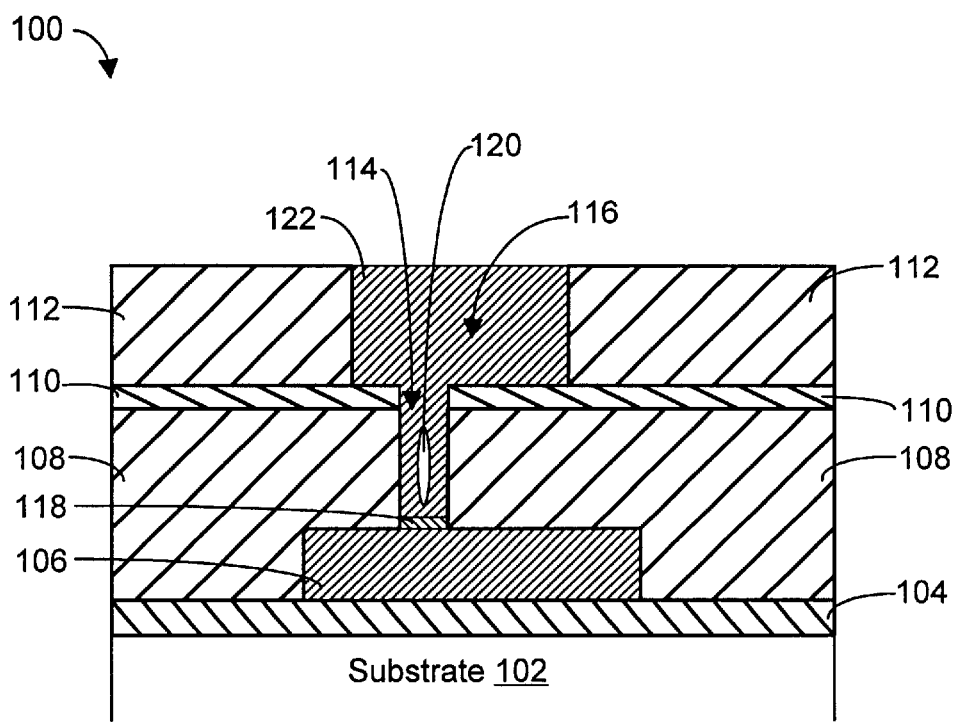
FIG. 1B illustrates the wafer stack after filling a via and a trench with a metal.
Figure 2A:
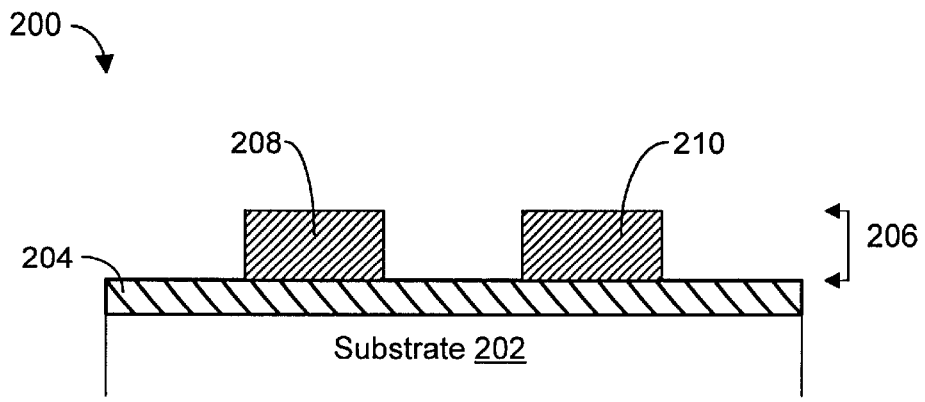
FIG. 2A illustrates a cross sectional view of a partially fabricated wafer stack including a substrate, an oxide layer, and a metal layer in accordance with one embodiment of the present invention.

FIG. 2A illustrates a cross sectional view of a partially fabricated wafer stack 200 including a substrate 202, an oxide layer 204, and a metal layer 206 in accordance with one embodiment of the present invention. The oxide layer 204 is disposed over the substrate 202 and may be in intermetal oxide (IMO) or dielectric layer. The metal layer 206 is formed over the oxide layer 204 and includes a pair of metal layer portions 208 and 210. The metal layer 206 can be deposited using any suitable deposition processes such as chemical vapor deposition (CVD), plasma enhanced CVD (PECVD), physical vapor deposition (PVD), and sputter deposition processes. The metal layer 206 is preferably of about 0.65 micron thickness and ranges between 0.4 to 1 micron in thickness. Although such metal layer thickness is described herein, those skilled in the art will readily appreciate that the present invention may be implemented with a metal layer of varying thickness.

In accordance with one embodiment of the present invention, the metal layer 206 may include aluminum (Al), copper (Cu), or any aluminum alloys such as Al—Cu, Al—Si, or Al—Cu—Si. It should be appreciated that other additional layers above, below or between the layers shown may be present in the wafer stack 200. For example, a barrier layer typically formed of Ti, TiW, TiN, or other suitable barrier materials may be disposed between the oxide layer 204 and the metal layer 206. The barrier layer, when provided, prevents the diffusion of silicon atoms from oxide layer 204 into the metal layer 206. In addition, not all the layers shown need be present and some or all may be substituted by other different layers.

Figure 2B:
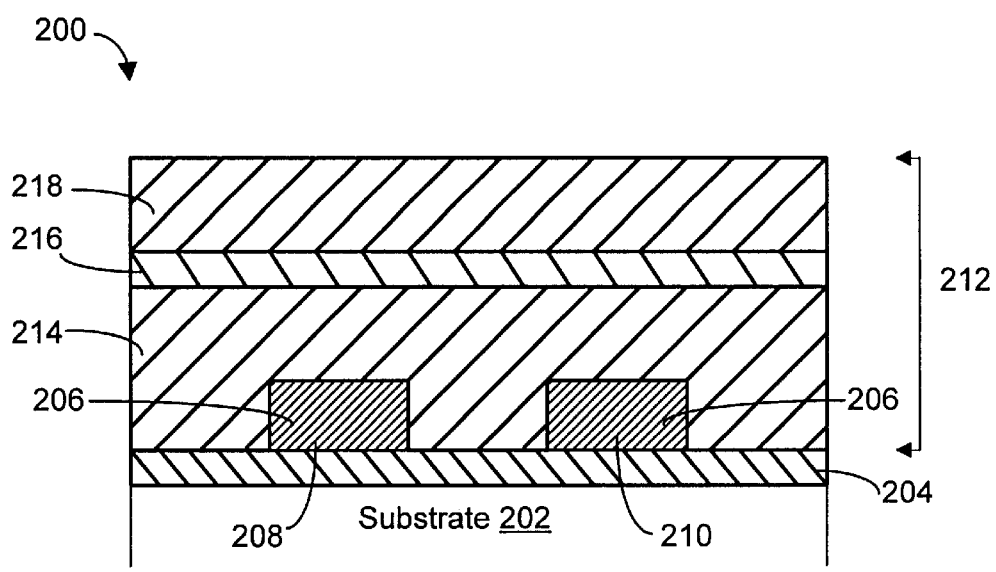
FIG. 2B shows a cross sectional view of the wafer stack after forming an IMO layer over the metal layer.

FIG. 2B shows a cross sectional view of the wafer stack 200 after forming an IMO layer 212 over the metal layer 206. The IMO layer 212 is formed by a CVD process, preferably a PECVD or a high density plasma CVD process. For example, the IMO layer 212 may be deposited by using CVD equipment such as ULTIMA CENTURA™ manufactured by Applied Materials, Inc. of Santa Clara, Calif.

In one embodiment, the IMO layer 212 is preferably a sandwich of IMO layers 214, 216, and 218. Using a CVD process, the IMO layers 214, 216, and 218 may be deposited one after another. More specifically, the IMO layer 214 is formed over the metal layer 206. The IMO layer 218 is formed over the IMO layer 216, which is formed over the IMO layer 214.

Preferably, the IMO layers 214 and 218 are $SiO_2$ layers while the IMO layer 216 is an SiN layer. The IMO layers 214 and 218 are each approximately 0.65 microns thick, and may range from 0.4 to 1 micron in thickness. On the other hand, the thickness of the IMO layer 216 is about 700 angstroms and may range between 400 to 1,000 angstroms. Although the IMO layer 214 uses $SiO_2$ and SiN layers with such thickness, it may also employ other suitable oxide layers having various thickness suitable as an IMO layer.

Figure 2C:
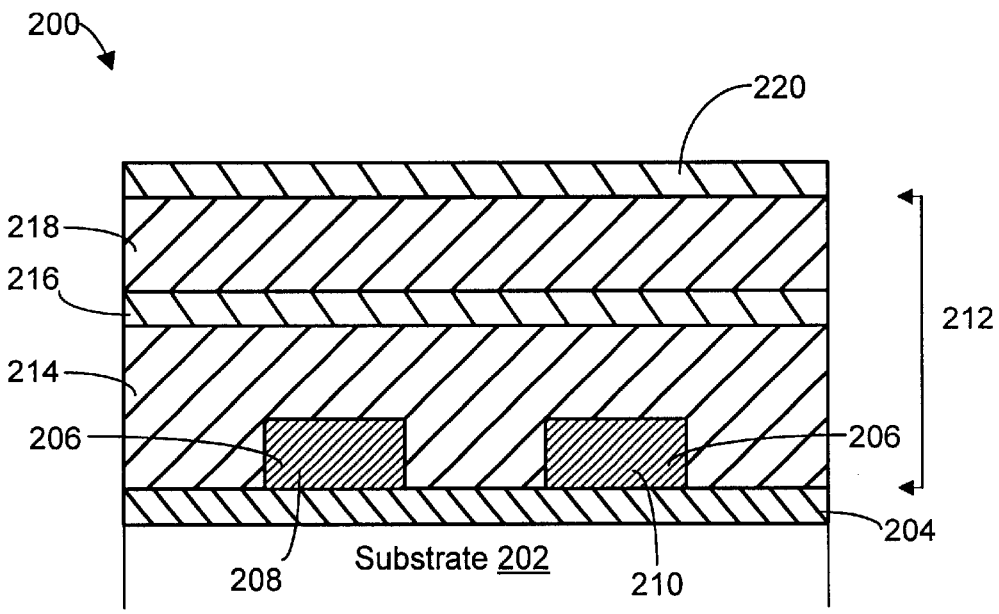
FIG. 2C illustrates a cross section of the wafer stack after forming an etch stop layer in accordance with one embodiment of the present invention.

FIG. 2C illustrates a cross section of the wafer stack 200 after forming an etch stop layer 220 in accordance with one embodiment of the present invention. The etch stop layer 220 is formed using a CVD process to a thickness between 400 to 1,000 angstroms in thickness. Preferably, the etch stop layer 220 deposited is about 700 angstroms in thickness. As will be mentioned below, the etch stop layer 220 serves to prevent etching of the IMO layer 214 underneath during a via etching process. The etch stop layer 220 is preferably an SiN layer. Although the etch stop layer 220 is an SiN layer with such thickness, it may also employ other suitable etch stop layers having various thickness suitable as an etch stop layer.

Figure 2D:
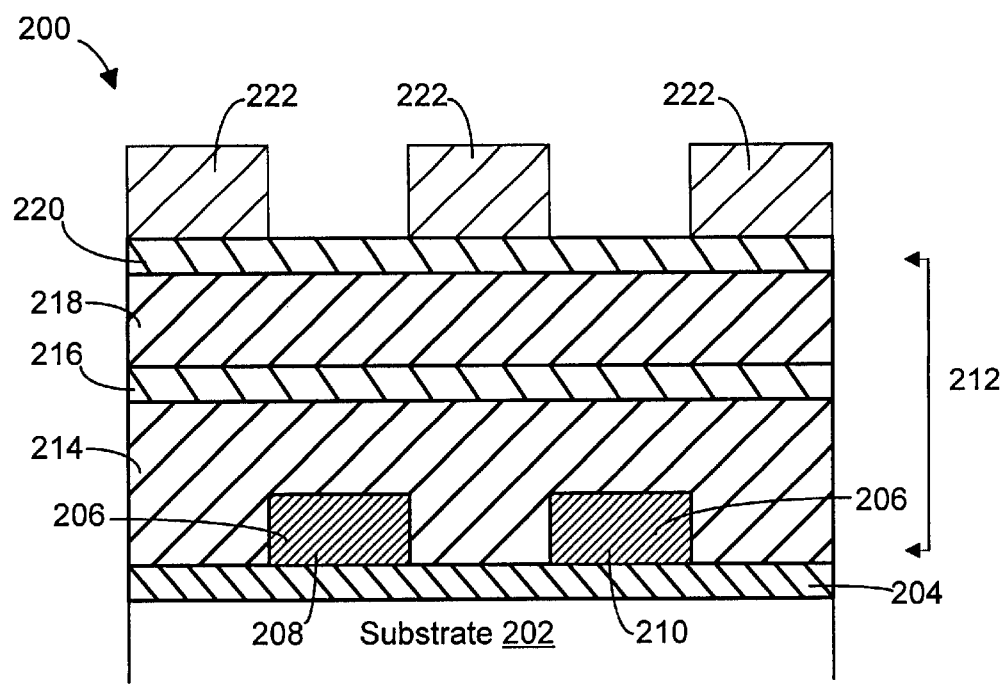
FIG. 2D shows a cross sectional view of the wafer stack after forming a photoresist layer for patterning trenches.

After forming the etch stop layer, a trench is formed in the wafer stack 200 over each of the metal layer portions 208 and 210 as depicted in FIGS. 2D through 2G. FIG. 2D shows a cross sectional view of the wafer stack 200 after forming a photoresist layer 222 for patterning trenches. The photoresist layer 222 is spin coated and patterned over the etch stop layer 220 to form a trench photomask through exposure and development using, for example, deep ultra-violet (UV) light. The trench photomask serves to define etching locations or portions in the etch stop and IMO layers 220 and 212 over the metal layer portions 208 and 210.

Figure 2E:
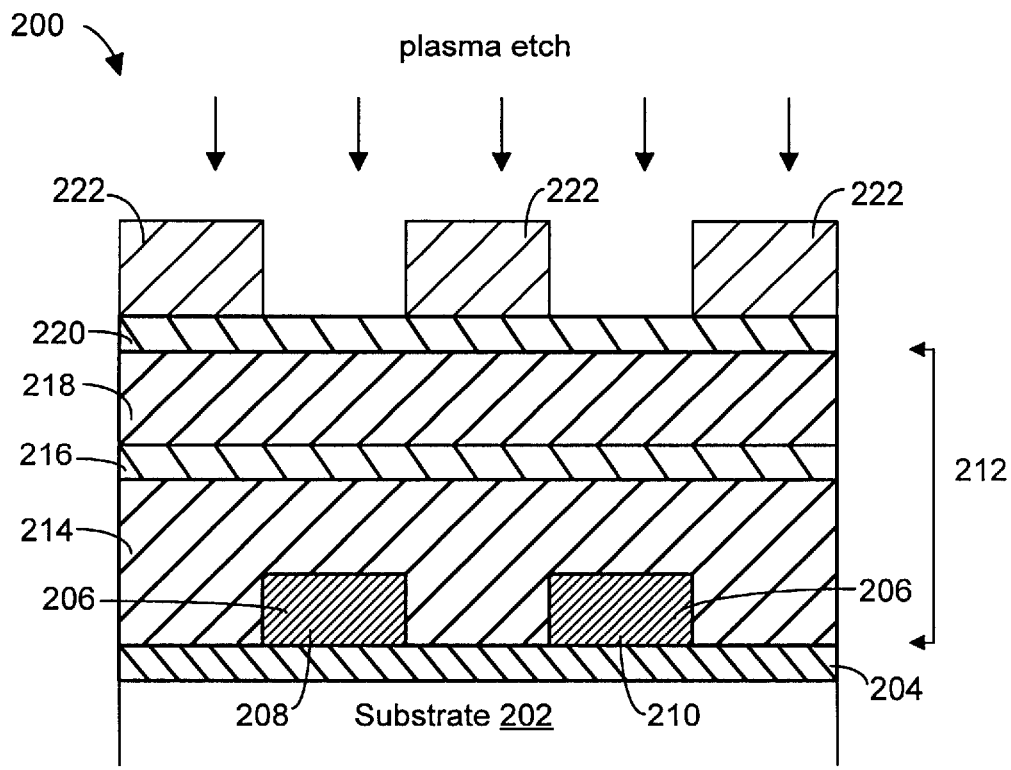
FIG. 2E illustrates a cross sectional view of the wafer stack being etched to form a pair of adjacent trenches over a pair of metal layer portions.

With the photoresist layer 222 defining the trench photomask, the etch stop and IMO layers 220 and 212 are etched in order to form a pair of adjacent trenches over the metal layer portions 208 and 210 as shown in FIG. 2E. During the etch process, the portions in the etch stop and IMO layers 220 and 212, respectively, that are not covered by the photoresist layer 222 and thus are exposed are etched. Preferably, the trench is etched using a plasma etching process carried out in a plasma etching apparatus such as LAM 4520XL™, manufactured by Lam Research of Fremont, Calif. The etch process proceeds through the exposed portions of the etch stop layer 220 and the IMO layer 212 until a desired thickness of the IMO layer 212 has been etched. In a preferred embodiment, the IMO layer 212 is etched through the IMO layers 218 and 216 until the IMO layer 214 is at least partially exposed. Some exemplary etchants that may be used to etch the IMO layer 218 in the IMO layer 212 are Ar, $CF_4$, CO, $C_4F_8$, and the like. On the other hand, the layer 216 in the IMO layer 212 may be etched using exemplary etchants such as $CHF_3$, $O_2$, and the like.

Figure 2F:
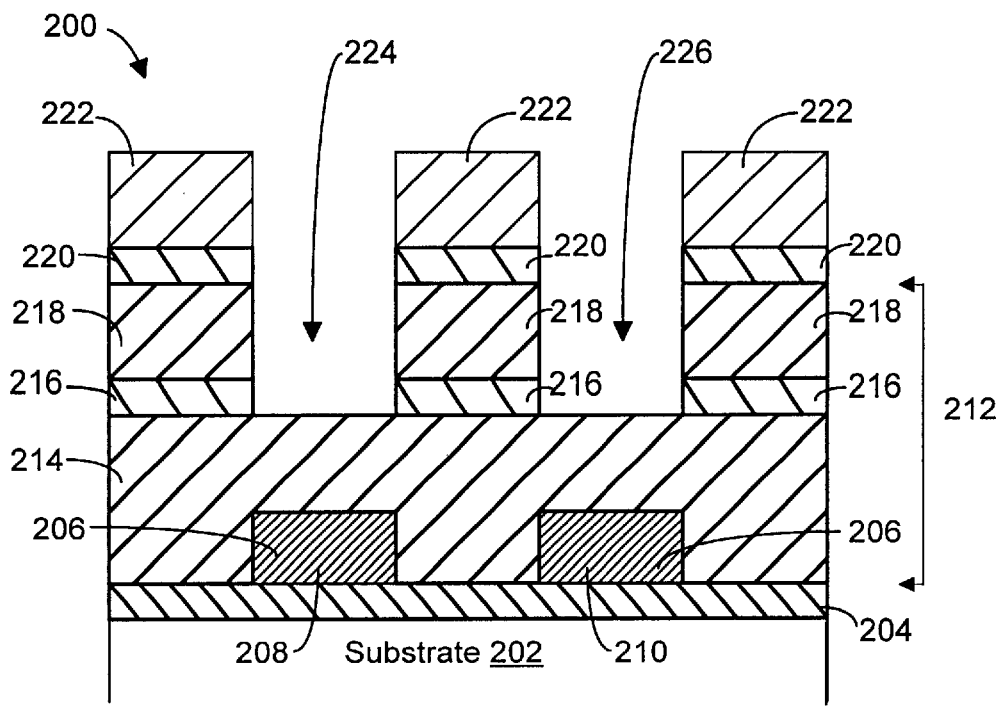
FIG. 2F illustrates a cross sectional view of the wafer stack including the pair of adjacent trenches.
Figure 2G:
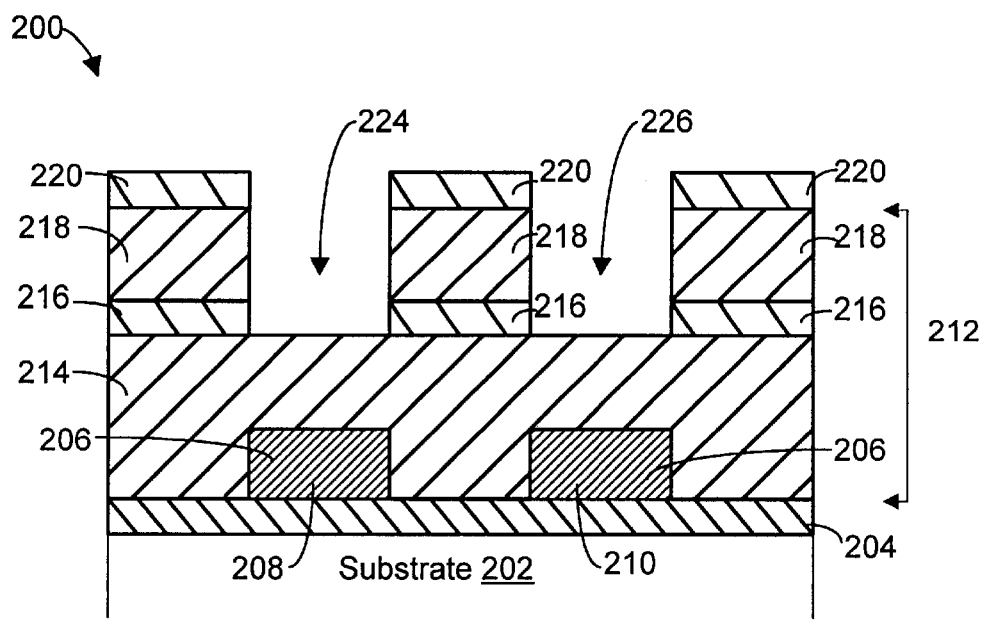
FIG. 2G shows a cross section of the wafer stack after the photoresist layer 222 has been stripped.

FIG. 2F illustrates a cross sectional view of the wafer stack 200 after the exposed portions of the etch stop layer 220 and the IMO layers 218 and 216 have been substantially etched through. The etch stop layer 220 and the IMO layers 218 and 216 have been etched to form a pair of trenches 224 and 226 in the wafer stack 224. In particular, the trench 224 is formed over the metal layer portion 208 and the trench 226 is formed over the metal layer portion 210. After forming the trenches 224 and 226, the photoresist layer 222 is stripped from the wafer stack 200. FIG. 2G shows a cross section of the wafer stack 200 after the photoresist layer 222 has been stripped.

After forming the trenches 224 and 226, a via is formed under each of the trenches 224 and 226 using a via mask to mask a set of adjacent vias in accordance with one embodiment of the present invention. To form a via that is properly aligned with and has the same width as the trench over it, the via size in the via mask is designed to be sufficiently large to mask a set of adjacent vias together, including any IMO or etch stop layer in between. When a via resist pattern is formed using the via mask, the resist pattern exposes the adjacent vias and any IMO or etch stop layer therebetween. As will be illustrated below, the enlarged via size together with the extra etch stop layer allows etching of a via that is of substantially the same width and alignment as the trench above the via.

To implement the via mask capable of masking a set of adjacent vias, the via size in the via mask is preferably sized up (i.e., increased) up to a specified via size from an original via size. The predetermined size of the via size in the via mask is the minimum spacing (i.e., distance) allowed between two adjacent vias in an integrated circuit design. In a preferred embodiment, the via size in the via mask is designed to mask a pair of adjacent vias together.

Figure 2H:
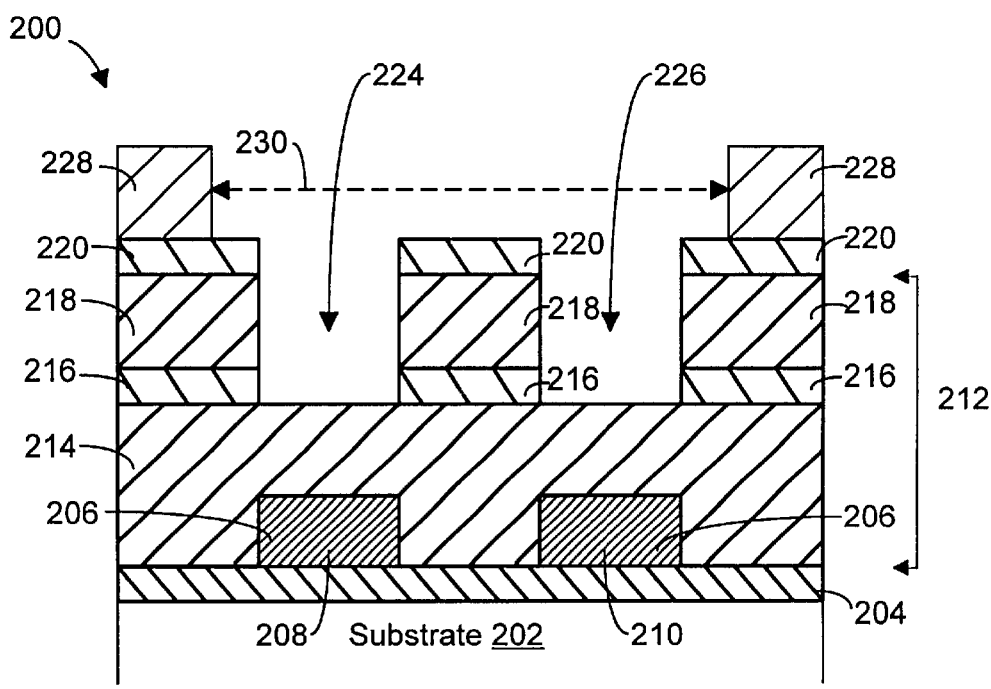
FIG. 2H shows a cross sectional view of the wafer stack including a photoresist layer patterned for etching vias under the adjacent trenches.

FIG. 2H shows a cross sectional view of the wafer stack 200 including a photoresist layer 228 patterned for etching vias under the trenches 224 and 226. The photoresist layer 228 is spin coated and then patterned over the etch stop layer 220 through a sized-up via mask (e.g., photomask) by exposure and development processes utilizing, for example, deep ultra-violet (UV) light. The patterned photoresist layer 228 defines an enlarged via 230, which is sufficiently large to expose the adjacent trenches 224 and 226 simultaneously for subsequently etching a pair of vias under the trenches 224 and 226.

Figure 2I:
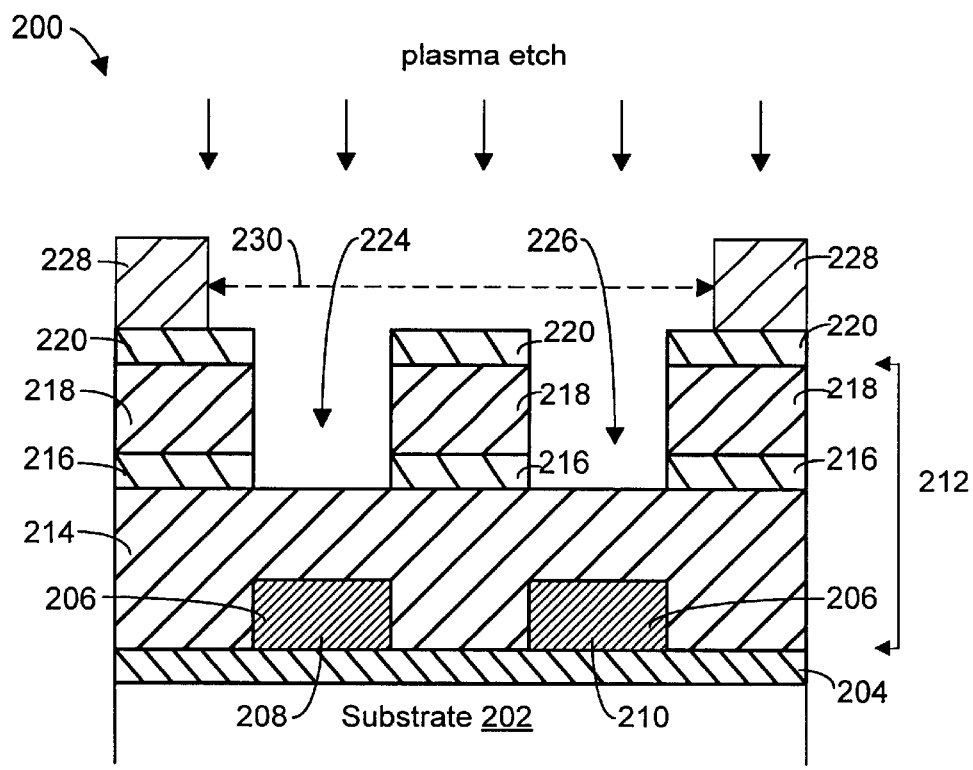
FIG. 2I shows a cross sectional view of the wafer stack while the IMO layer over the metal portions is being etched.

FIG. 2I shows a cross sectional view of the wafer stack 200 while the IMO layer 212 over the metal portions 208 and 210 is being etched. The patterned photoresist layer 228 defines an enlarged via 230 through which the IMO layer 212 between and under the trenches 224 and 226 is exposed for etching. The etch stop layer 220 protects the IMO layer 212 underneath from being etched substantially. On the other hand, the unprotected or exposed IMO layer 212 (e.g., IMO layer 214) under the trenches 224 and 226 is etched to form vias over the metal layer portions 208 and 210. During the etch process, the exposed portions in the IMO layer 212 (e.g., IMO layer 214) that are not covered by either the photoresist layer 228 or the etch stop layer 220 are substantially etched to form the vias. Preferably, the vias are etched using a plasma etching process carried out in a plasma etching apparatus such as Lam 4520XL™, manufactured by Lam Research of Fremont, Calif. Some exemplary etchants that may be used to etch the layer 214 in the IMO layer 212 in forming the vias are Ar, $CF_4$, CO, $C_4F_8$, and the like.

The etch process proceeds through the exposed portions of the the IMO layer 212 (e.g., IMO layer 214) until a desired thickness of the IMO layer 212 has been etched. In a preferred embodiment, the IMO layer 212 is etched through the IMO layers 218 and 216 until the IMO layer 214 is at least partially etched through so that the metal portions 206 and 208 become exposed to form a suitable metal via over the metal portions 206 and 208.

Figure 2J:
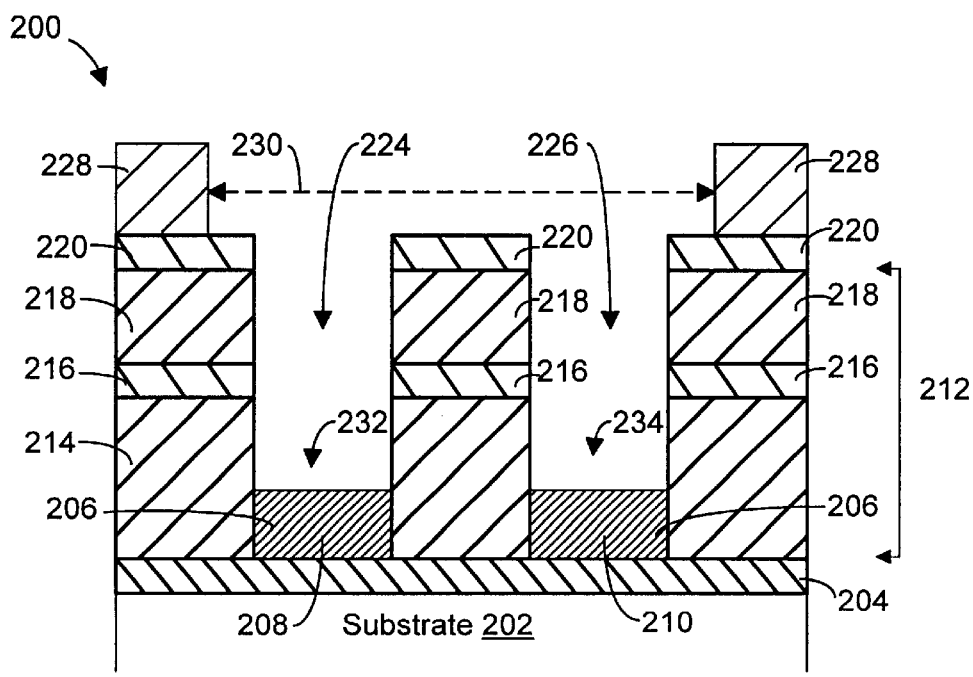
FIG. 2J illustrates a cross section of the wafer stack 200 after etching a pair of vias through the IMO layer.
Figure 2K:
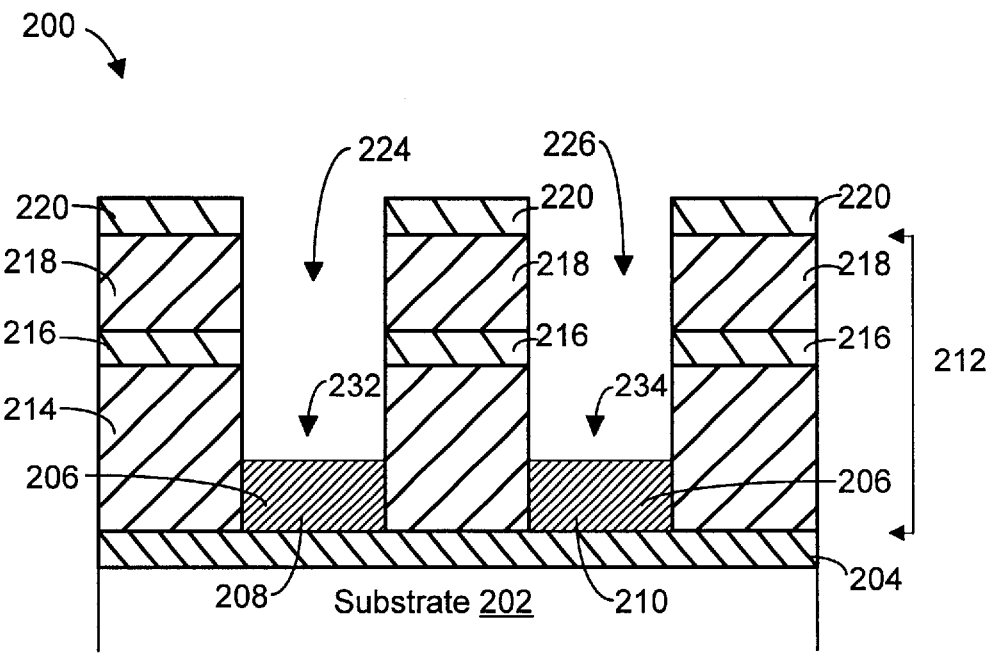
FIG. 2K shows a cross sectional view of the wafer stack after stripping the patterned photoresist layer.

FIG. 2J illustrates a cross section of the wafer stack 200 after etching a pair of vias 232 and 234 through the IMO layer 212 (e.g., IMO layer 214). The wafer stack includes the vias 232 and 234 that are formed under the trenches 224 and 226, respectively. As shown in FIG. 2J, the vias 232 and 234 formed under the trenches 224 and 226 are substantially the same size as and in proper alignment with the trenches 224 and 226, respectively. Hence, the vias 232 and 234 exhibit neither the misalignment nor the high aspect ratio problems of the conventional vias fabricated using a traditional dual damascene process. FIG. 2K shows a cross sectional view of the wafer stack 200 after stripping the patterned photoresist layer 228.

Figure 2L:
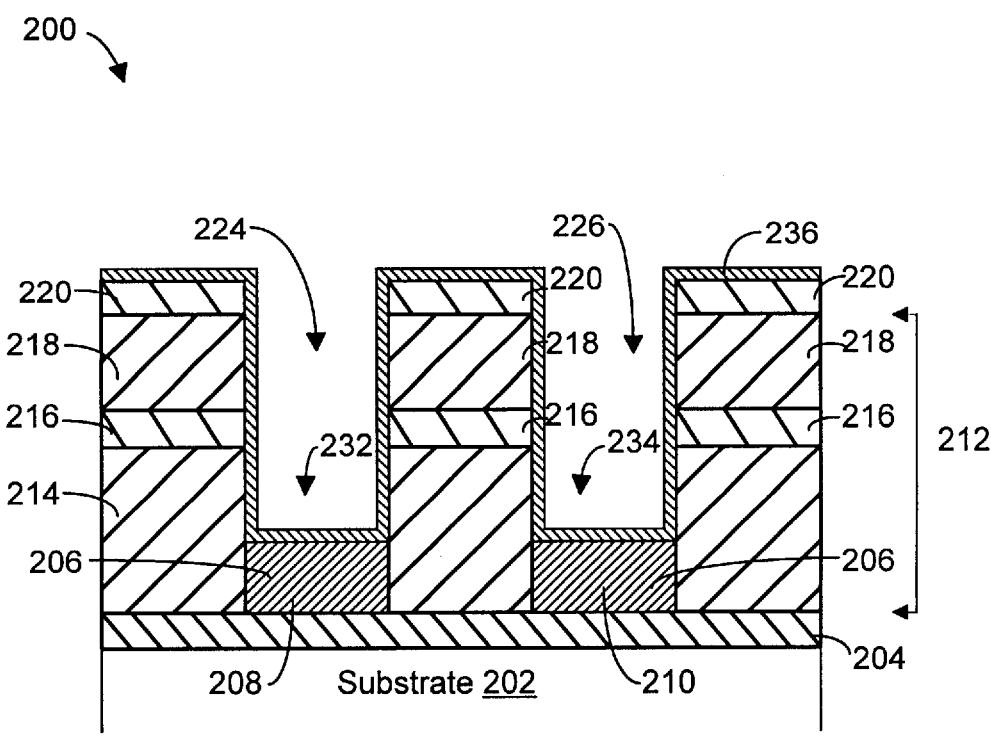
FIG. 2L shows a cross section of the wafer stack with a barrier layer.

FIG. 2L shows a cross section of the wafer stack 200 with a barrier layer 236. The barrier layer 236 includes one or more metals such as TiN, Ta (tantalum), TaN, TiW, TaSiN, and WN. The metal barrier layer 236 serves to prevent adverse effects (e.g., pitting, spiking, diffusion, etc.) that may result from a contact between an oxide layer (e.g., IMO layer 212) and a metal layer.

The barrier layer 236 is deposited, preferably in a conformal manner, over the etch stop layer 220, the trenches 224 and 226, and the vias 232 and 234 such that the barrier layer 236 is formed over the etch stop layer 220, the side walls of the IMO layer 212, and the metal portions 208 and 210. In general, the barrier layer 236 may be deposited by a sputter deposition or CVD process. However, for a barrier layer such as TiN layer, the present invention uses an ionized metal plasma PVD process using a PVD apparatus such as ENDURA SYSTEM™ from Applied Materials, Inc. of Santa Clara, Calif.

Figure 2M:
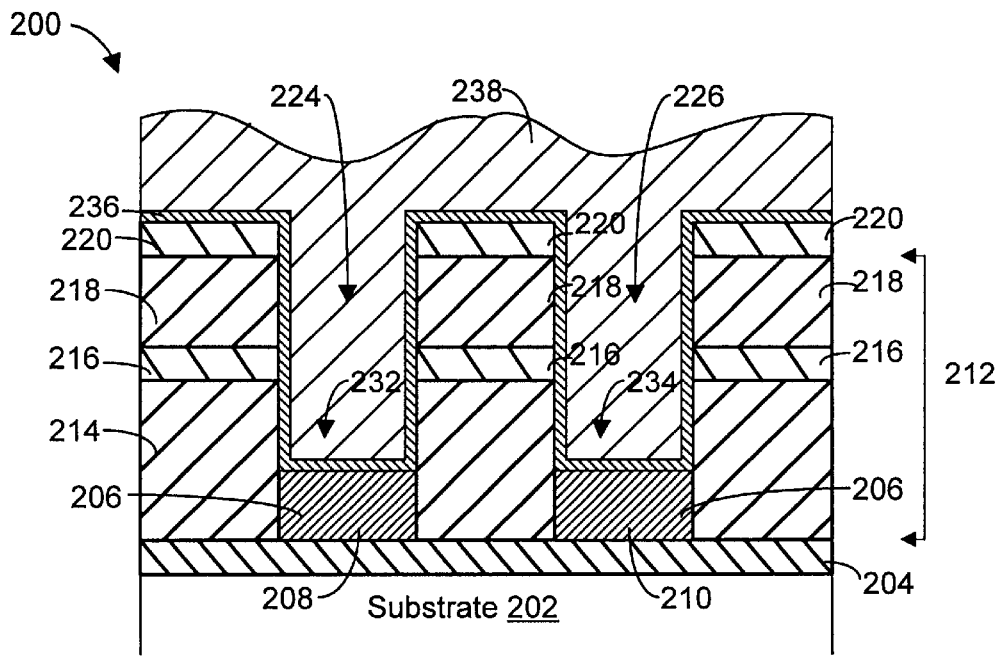
FIG. 2M illustrates a cross sectional view of the wafer stack including a metal layer deposited over the barrier layer.

FIG. 2M illustrates a cross sectional view of the wafer stack 200 including a metal layer 238 deposited over the barrier layer 236. The metal layer 238 is deposited over the barrier layer 236 in a conformal manner to fill the vias 232 and 234 and the trenches 224 and 226, preferably completely. It should be noted that since the vias 232 and 234 are properly aligned and have the same width as the trenches 224 and 226, respectively, the vias 232 and 234 are easier to fill with the metal layer 238 than in conventional vias with high aspect ratios. Hence, void is less likely to form in vias 232 and 234.

In accordance with one embodiment of the present invention, the metal layer 238 may include Al, Cu, or any of the known aluminum alloys such as Al—Cu, Al—Si, or Al—Cu—Si. For Cu, the preferred deposition method is electrochemical deposition using a deposition apparatus such as LT210™ from Semitool Inc. of Kalispell, Mont. The preferred deposition method for Al is sputter deposition or CVD process. Although such deposition processes are used, it should be appreciated that the metal layer 236 may be deposited using any suitable deposition processes such as CVD, PECVD, PVC, and sputter deposition processes.

Figure 2N:
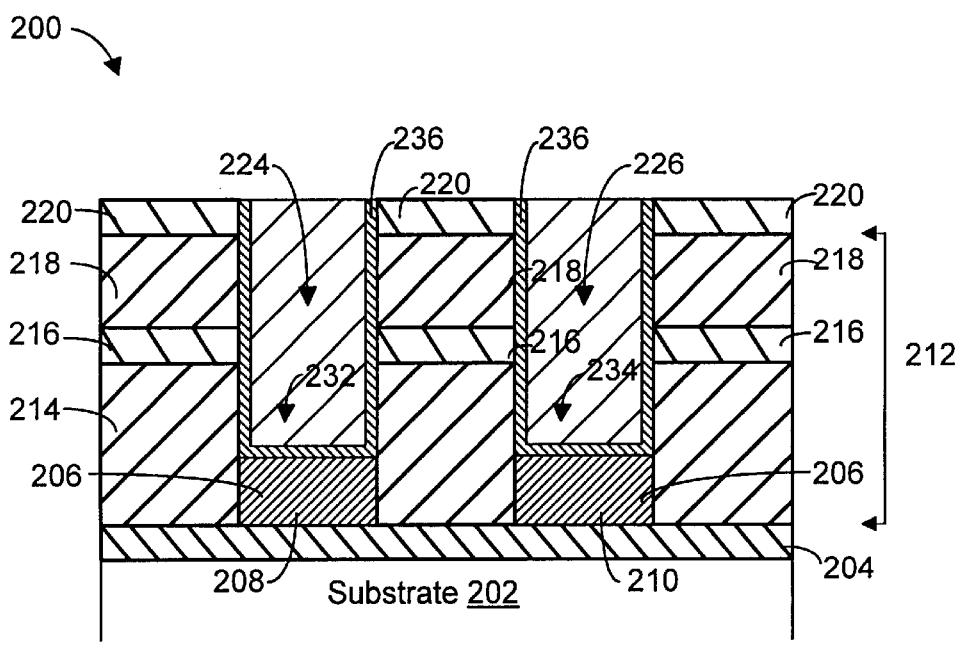
FIG. 2N shows a cross sectional view of the wafer stack including the filled vias and the filled trenches.

FIG. 2N shows a cross sectional view of the wafer stack 200 including the filled vias 232 and 234 and the filled trenches 224 and 226. The metal layer 238 and the barrier layer 226 above the top of the etch stop layer 220 (i.e., top of the trenches 224 and 226) have been removed by a chemical-mechanical polishing (CMP) process. The metal vias 232 and 234 serve as contact for the metal portions 208 and 210, respectively, while the metal trenches 224 and 226 serve as interconnects to the metal portions 208 and 210, respectively. The CMP of the metal layer 238 and the barrier layer 236 leaves the metal vias 232 and 234 and the metal trenches 224 and 226. The CMP of the metal layer 238 and the metal barrier layer 236 may be carried out in a CMP system such as STRAUSBAUGH 6CA POLISHER™ from Strausbaugh Inc., of San Luis Obispo, Calif.

Figure 3:
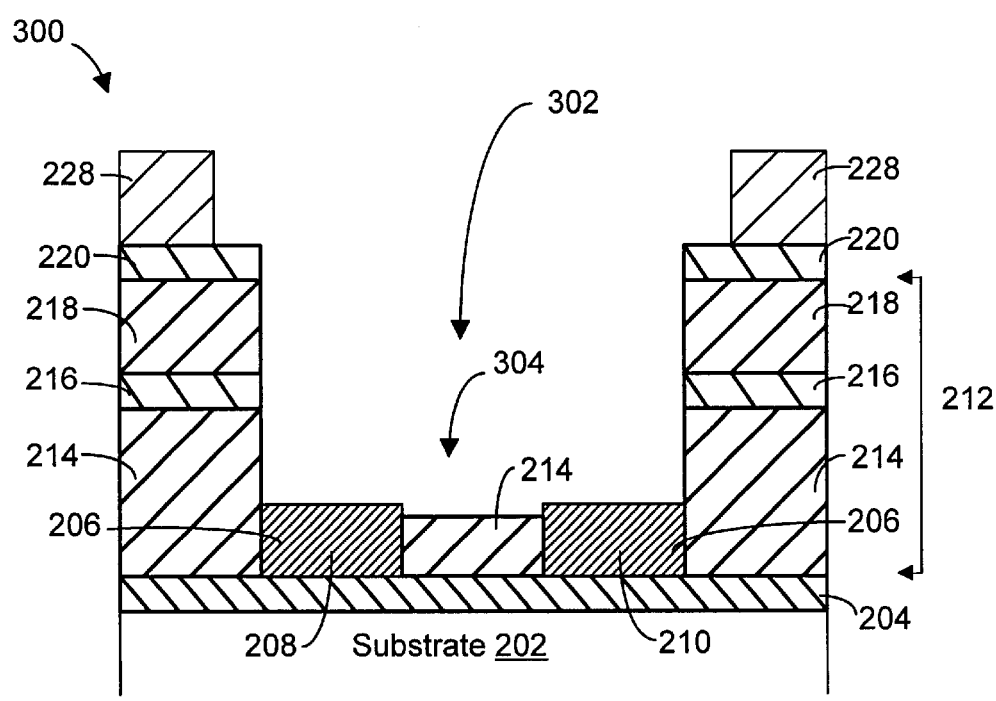
FIG. 3 illustrates a cross sectional view of the wafer stack after forming a merged trench and a merged via.

The metal filled vias 232 and 234 of the wafer stack 200 in one embodiment of the present invention form metal contacts for the metal portions 208 and 210, respectively. In another embodiment of the present invention, two adjacent vias 232 and 234 may be connected to the same metal (e.g., metal layer 206). In this case, the etch stop layer 220 is not formed over the IMO layer between the vias 232 and 234. For example, FIG. 3 illustrates a cross sectional view of the wafer stack after forming a merged trench 302 and a merged via 304. Since the enlarged via mask merges adjacent vias, the etching the IMO layer over the metal layer 206 results in the formation of the single large via 302.

Figure 4:
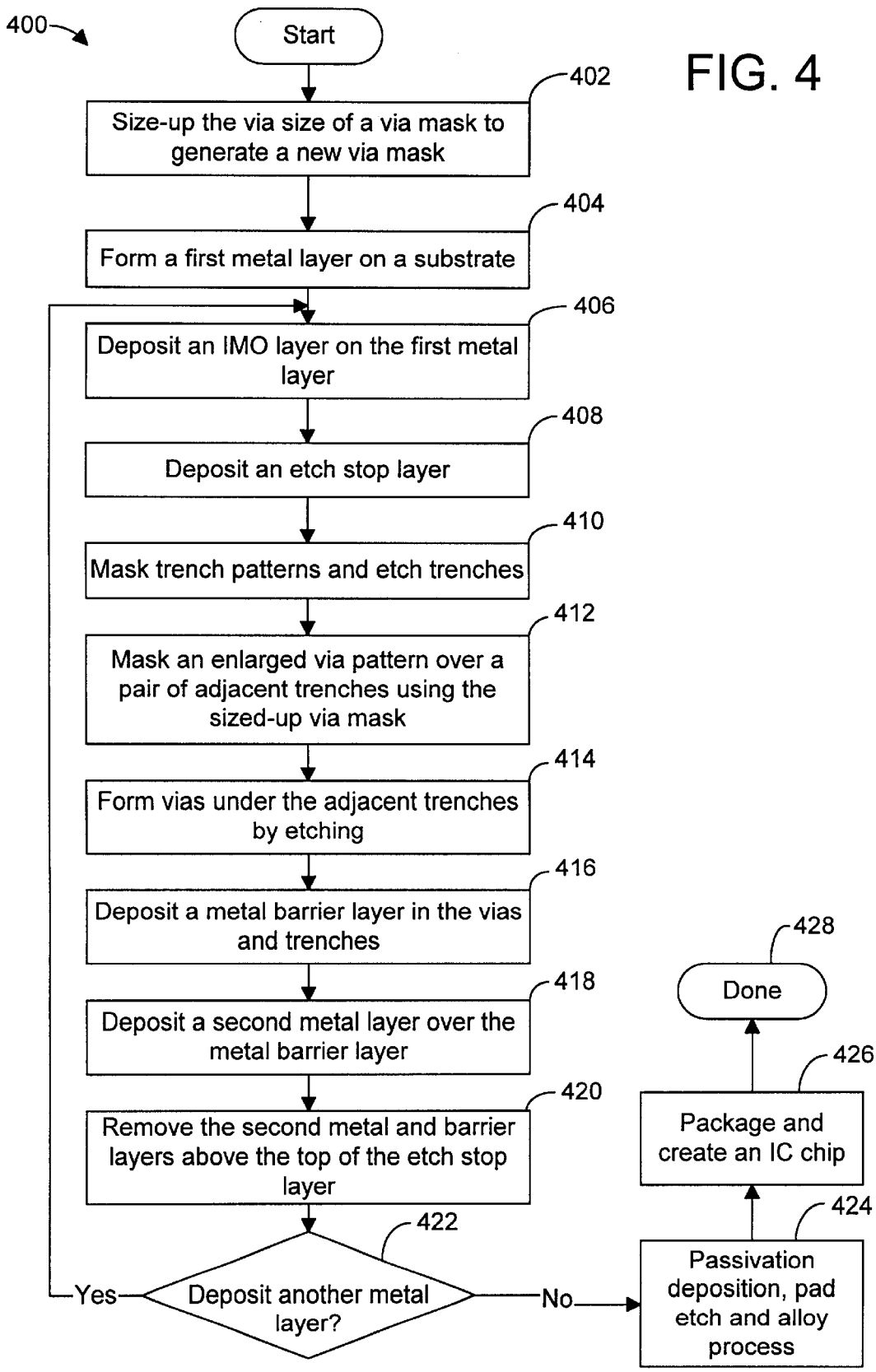
FIG. 4 shows a flow chart of a method for forming aligned vias under trenches in a dual damascene process in accordance with one embodiment of the present invention.

FIG. 4 shows a flow chart of a method 400 for forming aligned vias under trenches in a dual damascene process in accordance with one embodiment of the present invention. In operation 402, the method 400 creates a new mask from an original via mask by increasing the via size up to a predetermined minimum spacing between adjacent vias.

That is, the via pattern in the via mask is sized-up from the original via mask to encompass a pair of adjacent vias. This enlargement of the via pattern is designed to expose a pair of adjacent trenches. Generating a new via mask by sizing-up an original via mask can be performed using, for example, mask generating software such as COMPUTER AIDED TRANSCRIPTION SYSTEM™ (CATS), which is available from Transcription Enterprizes Limited of Los Gatos, Calif.

In operation 404, the method 400 forms a first metal layer on a substrate or an oxide layer formed on the substrate. The metal layer preferably includes Al or Cu. The first metal layer may be deposited through any suitable deposition processes such as CVD, PECVD, PVD, and sputter deposition. In one embodiment, a metal stack containing two or more metal layers may be deposited as the first metal layer. For example, a metal stack may include an Al layer between one or more TiN or TiW layers. In another embodiment, a metal stack may include a Cu layer between one or more Ta or TaN layers.

The method 400 then proceeds to operation 406, where an IMO layer is deposited over the first metal layer. The IMO layer may include one or more oxide layers such as $SiO_2$, SiN, etc. The IMO layer is deposited on the first metal layer using deposition processes such as CVD, PECVD, and high density plasma CVD.

Then in operation 408, an etch stop layer (e.g., SiN layer) is deposited over the IMO layer. The etch stop layer is serves to prevent etching of the IMO layer underneath during a via etching process. In operation 410, after depositing the IMO layer over the first metal layer, a trench pattern is masked and a plurality of trenches are etched in the IMO layer to a predetermined depth. A preferred embodiment uses an IMO layer sandwich including an SiN layer sandwiched between two $SiO_2$ layers. In this configuration, the trenches are etched through the top $SiO_2$ layer and the SiN layer.

The method 400 then proceeds to operation 412, where the sized-up via mask is used to form a patterned resist layer over the etch stop layer. The patterned resist layer exposes a pair of adjacent trenches and any IMO or etch stop layer in between during a subsequent etching process. Next, the exposed IMO layer is etched through to expose the first metal layer at least partially to form vias under the adjacent trenches in operation 414. The etch stop layer substantially protects the IMO layer underneath from being etched. Since the enlarged via size in the via resist pattern exposes both of the adjacent trenches simultaneously, the vias etched under the trenches have substantially the same width as the trenches above. Hence, each of the vias are properly aligned with its associated trench. Accordingly, aspect ratios are significantly reduced in comparison with vias formed by a conventional dual damascene process. After the vias have been etched, the patterned resist layer is stripped from the etch stop layer.

In operation 416, a metal barrier layer is deposited, preferably conformally, over the in the vias and trenches. The metal barrier layer is deposited so that it covers the interior walls defining the trenches and the vias. The metal barrier layer may be deposited by sputter deposition, CVD, or ionized metal plasma PVD. The barrier layer may include one or more barrier metal layers including TiN, Ta, TaN, TiW, TaSiN, and WN.

Then in operation 418, a second metal layer is deposited over the first barrier layer so that the second metal layer fills the vias and the trenches. The second metal layer includes preferably Al or Cu, although other metals may also be utilized. For Cu layer, the preferred deposition method is electrochemical deposition. On the other hand, the preferred deposition method for Al is sputter deposition or CVD process. Although such deposition processes are used, it should be appreciated that the metal layer may be deposited using any suitable deposition processes such as CVD, PECVD, PVD, and sputter deposition processes.

Next in operation 420, the second metal layer and the barrier layer above the top of the etch stop layer (i.e., above the top of the trenches) is removed through CMP. The CMP process leaves the vias and the trenches filled with the second metal layer. At this time, if another metal layer is to be deposited, the method 400 proceeds back to operation 406 to form multi-level interconnects and vias. If not, the method proceeds to operation 424, where the processed semiconductor wafer stack undergoes well known passivation deposition, pad etch and alloy processes. Then in operation 426, the semiconductor wafer stack is packaged for creating an integrated circuit. The method 400 then terminates in operation 428.

Advantageously, the present invention forms a resist layer arranged in a via pattern that is of sufficient size to expose a set of adjacent trenches together to etch a via in an oxide layer under each of the trenches. In addition, by providing an etch stop layer over an oxide layer, the present invention protects the oxide layer from being etched. The etching of the oxide layer using the combination of the resist layer and the etch stop layer ensures the formation of a via that is of same width as and in alignment with the trench above it. As a result, the vias will have significantly lower aspect ratio than vias formed through a conventional dual damascene process. Accordingly, the vias will be less prone to voiding problems when they are subsequently filled with a metal.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

What is claimed is:

1. A method for forming aligned vias under adjacent trenches to prevent voiding in a dual damascene process, the method comprising:

forming a pair of adjacent first metal layer portions over a semiconductor substrate;

forming an oxide layer over the adjacent first metal layer portions and the semiconductor substrate;

forming an etch stop layer over the oxide layer;

forming a set of adjacent trenches over the pair of adjacent first metal layer portions in the oxide layer through portions of the etch stop layer with one trench per first metal layer portion;

forming a resist layer at least partially over the etch stop layer, the resist layer defining a via pattern having an enlarged via opening adapted to expose the pair of adjacent trenches; and etching a pair of aligned vias through the enlarged via opening in the oxide layer under the set of adjacent trenches until the oxide layer is etched through to expose the adjacent first metal layer portions so as to form a via under each of the adjacent trenches, the etch stop layer inhibiting the oxide layer underneath from being etched substantially, each of the vias formed under the each of the adjacent trenches being substantially of a same width as and in alignment with the associated trench above.

2. The method as recited in claim 1, further comprising:
conformally forming a barrier layer in the trenches and the vias; and
forming a second metal layer over the barrier layer in the vias and the trenches to simultaneously form metal contacts and metal lines.

3. The method as recited in claim 2, wherein second metal layer forming comprises:
depositing the second metal layer over the barrier layer so as to fill the trenches and the vias; and
removing the second metal layer above the metal filled trenches by a chemical-mechanical polishing process.

4. The method as recited in claim 1, wherein the etch stop layer is an SiN layer.

5. The method as recited in claim 1, wherein the trench forming comprises:
photomasking the etch stop layer with a trench pattern; and
etching the portions of the etch stop layer and the oxide layer underneath the etch stop layer portions to a specified depth to form the set of adjacent trenches in the oxide layer.

6. The method as recited in claim 5, wherein the etch stop layer photomasking comprises:
spin coating a photoresist material over the etch stop layer;
exposing the coated photoresist material under a light source through the trench pattern; and
developing the coated photoresist material into the photoresist layer adapted to function as a trench pattern photomask.

7. The method as recited in claim 1, wherein the set of adjacent trenches is a pair of adjacent trenches.

8. The method as recited in claim 1, wherein the set of adjacent trenches is at least two adjacent trenches.

9. The method as recited in claim 1, wherein the oxide layer is an intermetal oxide layer.

10. The method as recited in claim 1, wherein the oxide layer comprises an oxide layer sandwich that includes an SiN layer sandwiched between a first and a second $SiO_2$ layers.

11. The method as recited in claim 10, wherein the set of adjacent trenches are formed through the first $SiO_2$ layer and the SiN layer and the vias are formed through the second $SiO_2$ layer.

12. The method as recited in claim 1, wherein the resist layer forming comprises:
spin coating a resist material over the etch stop layer;
exposing the coated resist material under a light source through a via mask having the via pattern; and
developing the coated resist material into the resist layer adapted to function into the resist layer.

13. The method as recited in claim 12, wherein the via pattern in the via mask is sized up to a spacing distance between the adjacent vias to expose the adjacent vias through the same enlarged via pattern.

14. The method as recited in claim 2, wherein the barrier layer is made of a barrier material that is selected from the group consisting essentially of TiN, Ta, TaN, TiW, TaSiN, and WN.

15. The method as recited in claim 2, wherein the first adjacent metal layer portions and the second metal layer are made of a metal that is selected from the group consisting essentially of Al, Cu, and Si.

16. A method for forming vias aligned with trenches to prevent voiding in a dual damascene process, the method comprising:
forming a set of adjacent first metal layer portions over a semiconductor substrate;
forming an intermetal oxide (IMO) layer over the adjacent first metal layer portions and the semiconductor substrate;
forming an etch stop layer over the IMO layer;
forming a set of adjacent trenches over the set of adjacent first metal layer portions in the IMO layer through portions of the etch stop layer with one trench per first metal layer portion;
forming a resist layer at least partially over the etch stop layer, the resist layer being formed to have an enlarged via opening defining an enlarged via pattern to expose the set of adjacent trenches through the enlarged via opening; and
etching the IMO layer under the set of adjacent trenches to form a set of aligned vias through the enlarged via opening until the IMO layer is etched through to expose the adjacent first metal layer portions so as to form a via under each of the adjacent trenches, the etch stop layer inhibiting the IMO layer underneath from being etched substantially, each of the vias formed under the each of the adjacent trenches being substantially of a same width as and in alignment with the associated trench above.

17. The method as recited in claim 16, further comprising:
conformally forming a barrier layer in the set of adjacent trenches and the vias; and
forming a second metal layer over the barrier layer in the vias and the trenches to form metal contacts and lines.

18. The method as recited in claim 17, wherein second metal layer forming comprises:
depositing the second metal layer over the barrier layer to fill the trenches and the vias underneath the trenches; and
removing the second metal layer above the metal filled trenches by a chemical-mechanical polishing process.

19. The method as recited in claim 16, wherein the etch stop layer is an SiN layer.

20. The method as recited in claim 16, wherein the trench forming comprises:
photomasking the portion of the etch stop layer with a trench pattern; and
etching the portions of the etch stop layer and the IMO layer under the etch stop layer portions to a specified depth to form the set of adjacent trenches in the IMO layer.

21. The method as recited in claim 20, wherein the etch stop layer photomasking comprises:
spin coating a photoresist material over the etch stop layer;
exposing the coated photoresist material under a light source through the trench pattern; and
developing the coated photoresist material into the photoresist layer adapted to function as a trench pattern photomask.

22. The method as recited in claim 16, wherein the set of adjacent trenches is a pair of adjacent trenches.

23. The method as recited in claim 16, wherein the set of adjacent trenches is at least two adjacent trenches.

24. The method as recited in claim 16, wherein the IMO layer comprises an IMO layer sandwich that includes an SiN layer sandwiched between a first and a second SiO$_2$ layers.

25. The method as recited in claim 24, wherein the set of adjacent trenches are formed through the first SiO$_2$ layer and the SiN layer and the vias are etched through the second SiO$_2$ layer.

26. The method as recited in claim 16, wherein the IMO layer forming includes:

depositing a first SiO$_2$ layer over the first metal layer;

depositing an SiN layer over the first SiO2 layer; and depositing a second SiO$_2$ layer over the SiN layer.

27. The method as recited in claim 16, wherein the resist layer forming comprises:

spin coating a resist material over the etch stop layer;

exposing the coated resist material under a light source through a via mask having the via pattern; and developing the coated resist material into the resist layer adapted to function into the resist layer.

28. The method as recited in claim 27, wherein the via pattern in the via mask is sized up to a spacing distance between the adjacent vias to expose the adjacent vias through the enlarged via pattern.

29. The method as recited in claim 17, wherein the barrier layer is made of a barrier material that is selected from the group consisting essentially of TiN, Ta, TaN, TiW, TaSiN, and WN.

30. The method as recited in claim 17, wherein the first adjacent metal layer portions and the second metal layer are made of a metal that is selected from the group consisting essentially of Al, Cu, and Si.

31. A method for forming aligned vias under trenches to prevent voiding in a dual damascene process, the method comprising:

forming, a set of adjacent first metal layer portions over a semiconductor substrate;

forming an oxide layer over the adjacent first metal layer portions and the semiconductor substrate;

forming an etch stop layer over the oxide layer such that the etch stop layer is not formed in the trenches;

forming a resist layer at least partially over the etch stop layer, the resist layer defining a via pattern having an enlarged via opening to expose a set of adjacent trenches through the enlarged via pattern; and forming a plurality of aligned vias under the trenches by etching the oxide layer under the trenches through the enlarged via opening until the oxide layer is etched through to expose the adjacent first metal layer portions, the etch stop layer inhibiting the oxide layer underneath from being etched substantially, each of the vias formed under the each of the trenches being substantially of a same width as and in alignment with the associated trench above.

32. The method as recited in claim 31, further comprising:

conformally forming a barrier layer in the trenches and the vias; and forming a second metal layer over the barrier layer in the vias and the trenches to form metal contacts and metal lines.

33. The method as recited in claim 32, wherein second metal layer forming comprises:

depositing the second metal layer over the barrier layer to fill the trenches and the vias with the second metal layer; and removing the second metal layer above the metal filled trenches by a chemical-mechanical polishing process.

34. The method as recited in claim 31, wherein the etch stop layer is an SiN layer.

35. The method as recited in claim 31, wherein the trench forming comprises:

photomasking the portion of the etch stop layer with a trench pattern; and etching the portions of the etch stop layer and the IMO layer underneath the etch stop layer portions to a specified depth to form the set of adjacent trenches in the IMO layer.

36. The method as recited in claim 35, wherein the etch stop layer photomasking comprises:

spin coating a photoresist material over the etch stop layer;

exposing the coated photoresist material under a light source through the trench pattern; and developing the coated photoresist material into the photoresist layer adapted to function as a trench pattern photomask.

37. The method as recited in claim 31, wherein the trenches are a pair of adjacent trenches.

38. The method as recited in claim 31, wherein the trenches are at least two adjacent trenches.

39. The method as recited in claim 31, wherein the oxide layer is an intermetal oxide layer.

40. The method as recited in claim 31, wherein the oxide layer comprises an oxide layer sandwich that includes an SiN layer sandwiched between a first and a second SiO$_2$ layers.

41. The method as recited in claim 40, wherein the trenches are formed through the first SiO$_2$ layer and the SiN layer.

42. The method as recited in claim 40, wherein the vias are formed through the second SiO$_2$ layer.

43. The method as recited in claim 31, wherein the resist layer forming comprises:

spin coating a resist material over the etch stop layer;

exposing the coated resist material under a light source through a via mask having the via pattern; and developing the coated resist material into the resist layer adapted to function into the resist layer.

44. The method as recited in claim 43, wherein the via pattern in the via mask is sized up to a spacing distance between the adjacent vias to expose the adjacent vias through the enlarged via pattern.

45. The method as recited in claim 32, wherein the barrier layer is made of a barrier material that is selected from the group consisting essentially of TiN, Ta, TaN, TiW, TaSiN, and WN.

46. The method as recited in claim 32, wherein the first metal layer portions and second metal layer are made of a metal that is selected from the group consisting essentially of Al, Cu, and Si.

* * * * *